(12) United States Patent
Yoshimoto

(10) Patent No.: US 11,978,787 B2
(45) Date of Patent: May 7, 2024

(54) THYRISTOR ASSEMBLY

(71) Applicant: Littelfuse, Inc., Chicago, IL (US)

(72) Inventor: Koichiro Yoshimoto, Brownsville, TX (US)

(73) Assignee: Littelfuse, Inc., Chicago, IL (US)

( * ) Notice: Subject to any disclaimer, the term of this patent is extended or adjusted under 35 U.S.C. 154(b) by 0 days.

(21) Appl. No.: 17/674,973

(22) Filed: Feb. 18, 2022

(65) Prior Publication Data

US 2022/0173232 A1 Jun. 2, 2022

Related U.S. Application Data

(62) Division of application No. 16/827,925, filed on Mar. 24, 2020, now Pat. No. 11,349,021.

(51) Int. Cl.
| | |
|---|---|
| *H01L 29/74* | (2006.01) |
| *H01L 23/367* | (2006.01) |
| *H01L 23/495* | (2006.01) |
| *H01L 29/66* | (2006.01) |
| *H01L 29/745* | (2006.01) |
| *H01L 29/747* | (2006.01) |
| *H03K 17/60* | (2006.01) |

(52) U.S. Cl.
CPC ........ *H01L 29/745* (2013.01); *H01L 23/3675* (2013.01); *H01L 23/49562* (2013.01); *H01L 23/49575* (2013.01); *H01L 29/66386* (2013.01); *H01L 29/74* (2013.01); *H01L 29/747* (2013.01); *H03K 17/60* (2013.01)

(58) Field of Classification Search
CPC ............. H01L 29/745; H01L 23/49562; H01L 29/66386; H01L 23/49575; H01L 2924/13033; H01L 29/74; H01L 29/747; H01L 23/3675; H01L 25/072; H01L 27/0211; H01L 27/101; H01L 29/744; H01L 45/14; H03K 17/60
See application file for complete search history.

(56) References Cited

U.S. PATENT DOCUMENTS

| | | | |
|---|---|---|---|
| 3,761,800 | A | 9/1973 | Howard |
| 4,163,181 | A | 7/1979 | Farber |
| 4,535,251 | A | 8/1985 | Herman et al. |
| 6,072,681 | A | 6/2000 | Cogan et al. |
| 7,242,078 | B2 * | 7/2007 | O'Shea .................. H01L 24/36 257/691 |

(Continued)

FOREIGN PATENT DOCUMENTS

| | | |
|---|---|---|
| CN | 101814496 A | 8/2010 |
| DE | 3716814 A1 | 12/1988 |

OTHER PUBLICATIONS

European Search Report and Written Opinion for Application No. EP21774978, mailed Aug. 8, 2023, 7 pages.

*Primary Examiner* — Shouxiang Hu
(74) *Attorney, Agent, or Firm* — KDW Firm PLLC

(57) ABSTRACT

A power control switch assembly. The assembly may include a thyristor device, where the thyristor device includes a first device terminal, a second device terminal, and a gate terminal> The assembly may include a negative temperature coefficient (NTC) device, electrically coupled to the gate terminal of the thyristor device on a first end, and electrically coupled to the first device terminal of the thyristor device on a second end, wherein the NTC device is thermally coupled to the thyristor device.

3 Claims, 8 Drawing Sheets

(56) References Cited

U.S. PATENT DOCUMENTS

| | | |
|---|---|---|
| 8,890,574 B2 | 11/2014 | Kim et al. |
| 2005/0194635 A1 | 9/2005 | Pfirsch |
| 2006/0011942 A1 | 1/2006 | Kim et al. |
| 2007/0072060 A1 | 3/2007 | Chang et al. |
| 2008/0012042 A1 | 1/2008 | Sugawara |
| 2016/0133777 A1 | 5/2016 | Zhang |
| 2017/0025331 A1* | 1/2017 | Kamiyama ....... H01L 23/49562 |
| 2018/0204789 A1 | 7/2018 | Yoshimoto |

* cited by examiner

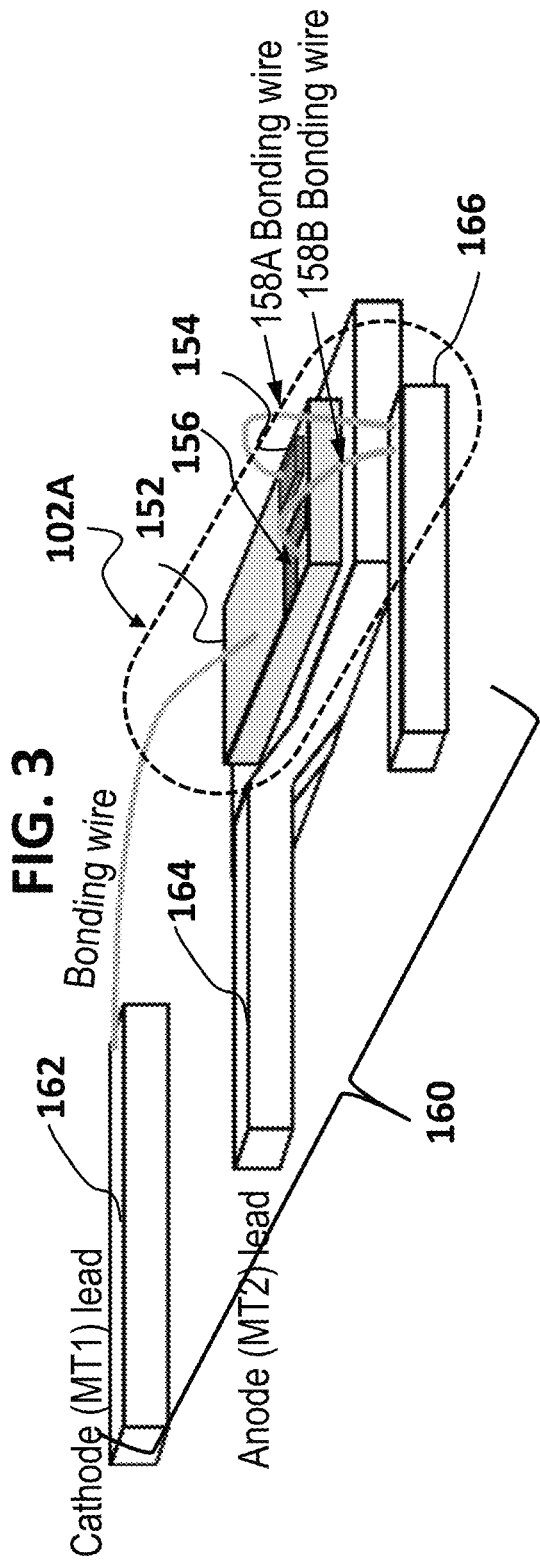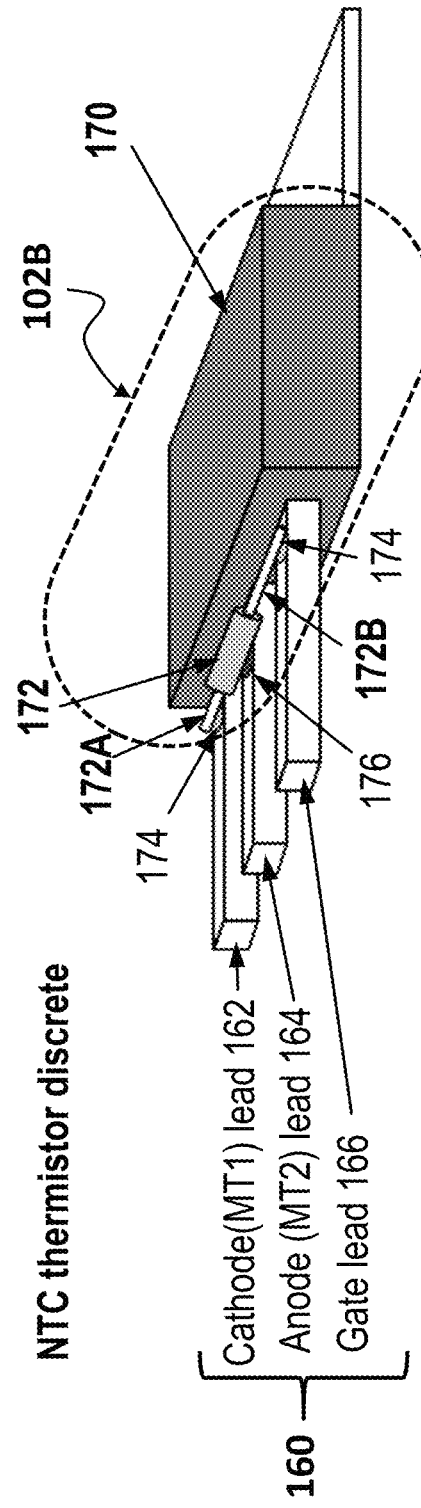

THYRISTOR ASSEMBLY

CROSS REFERENCE TO RELATED APPLICATION

This application is a divisional of, and claims the benefit of priority to, U.S. patent application Ser. No. 16/827,925, filed Mar. 24, 2020, entitled "Thyristor Assembly," which application is incorporated herein by reference in its entirety.

BACKGROUND

Field

The present embodiments are related to the field of power switches, and more particularly to Thyristor type devices.

Discussion of Related Art

Thyristors, silicon controller rectifiers and related devices, such as a TRIAC are widely used for alternating current (AC) power control applications. Thyristors, such as SCRs and TRIACs, may operate as an electric power switch. More particularly, Thyristors are characterized by an ability to switch rapidly from a state of non-conducting current to a state of—conduction. In operation, thyristors turn on, switching from high impedance state to low impedance state, by applying a voltage between a gate and cathode, and running current from gate to cathode. This voltage required for turn on (triggering) of the thyristor is termed $V_{GT}$, while the gate trigger current is referred to as $I_{GT}$. SCRs and TRIACs exhibit a negative temperature dependency of the IGT (gate trigger current), dV/dt, and commutating dV/dt capability. At higher temperatures, the values of these entities—decrease and may become too low for practical applications. More particularly, when the value $I_{GT}$ at higher temperature becomes too low, problems may take place such as false-triggering of the Thyristor in an off-state by a small noise signal into the gate terminal, while no gate current is applied by a controller, or a high dV/dt applied to main terminals.

Adding an external gate resistor (RGK) to a thyristor device may improve the aforementioned electrical characteristics, but the fixed resistance value of the RGK component increases the value of IGT at room temperature, and increases stress on a driving circuit. Moreover, a low IGT requirement for thyristor devices is very common in order to enable the ability of a microcontroller to directly drive the thyristor without use of a separate current-boosting circuit. In other words, known microcontrollers may be limited to supplying 2-5 mA to drive a thyristor, establishing a threshold, above which threshold a microcontroller will not be able to drive the thyristor. Thus, increasing IGT with the use of a RGK may not be compatible for operation of the thyristor with microcontrollers. Moreover, because the gate trigger current to be supplied by the microcontroller to drive a thyristor may be just 2-5 mA at room temperature, a significant degradation in gate trigger current with increased temperature may result in very small values of current causing triggering of the thyristor at elevated temperatures.

With respect to these and other considerations, the present disclosure is provided.

SUMMARY

In various embodiments, power control switch assemblies and methods of formation are provided. In one embodiment, a power control switch assembly may include a thyristor device, where the thyristor device includes a first device terminal, a second device terminal, and a gate terminal> The assembly may include a negative temperature coefficient (NTC) device, electrically coupled to the gate terminal of the thyristor device on a first end, and electrically coupled to the first device terminal of the thyristor device on a second end, wherein the NTC device is thermally coupled to the thyristor device.

In another embodiment, a thyristor device assembly, may include a thyristor device, having a first device terminal, a second device terminal, and a gate terminal. The thyristor device assembly may include a housing, disposed around the thyristor device, and a lead frame, disposed in electrical contact with the thyristor device. The lead frame may include a gate lead and a first terminal lead, electrically coupled to the gate and the first device terminal of the thyristor device, respectively. The thyristor device assembly may further include a negative temperature coefficient (NTC) device, the NTC device being electrically coupled to the gate on a first end, and being electrically coupled to the cathode on a second end.

In another embodiment, a method of forming a thyristor device may include providing a thyristor, comprising a first terminal, a second terminal, and a gate. The method may also include providing a negative temperature coefficient (NTC) device, electrically connecting a first end of the NTC device to the gate on a first end, and electrically connecting a second end of the NTC device to the first main terminal on a second end, wherein the NTC device is thermally coupled to the thyristor.

BRIEF DESCRIPTION OF THE DRAWINGS

FIG. 3 presents a top perspective view of a thyristor device assembly according to some embodiments of the disclosure;

FIG. 4 presents a top perspective view of an additional thyristor device assembly according to some embodiments of the disclosure;

DESCRIPTION OF EMBODIMENTS

Figure 2:
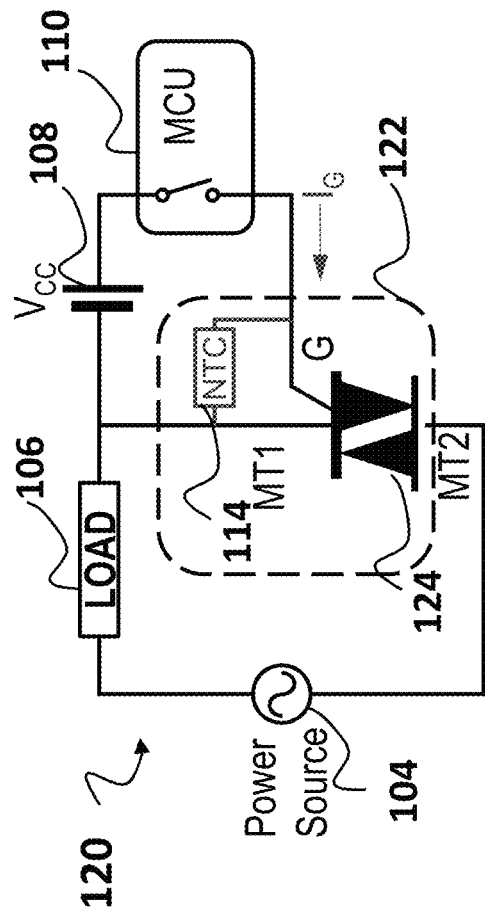
FIG. 2 presents a circuit representation of another switch arrangement according to other embodiments of the disclosure.

The present embodiments will now be described more fully hereinafter with reference to the accompanying drawings, in which exemplary embodiments are shown. The embodiments are not to be construed as limited to the embodiments set forth herein. Rather, these embodiments are provided so that this disclosure will be thorough and complete, and will fully convey their scope to those skilled in the art. In the drawings, like numbers refer to like elements throughout.

In the following description and/or claims, the terms "on," "overlying," "disposed on" and "over" may be used in the following description and claims. "On," "overlying," "disposed on" and "over" may be used to indicate that two or more elements are in direct physical contact with one another. Also, the term "on,", "overlying," "disposed on," and "over", may mean that two or more elements are not in direct contact with one another. For example, "over" may mean that one element is above another element while not contacting one another and may have another element or elements in between the two elements. Furthermore, the term "and/or" may mean "and", it may mean "or", it may mean "exclusive-or", it may mean "one", it may mean "some, but not all", it may mean "neither", and/or it may mean "both", although the scope of claimed subject matter is not limited in this respect.

In various embodiments, a hybrid device is provided including a thyristor device such as a TRIAC (triode for alternating current), as well as an NTC device acting as a thermal switch. The apparatus may be arranged in a configuration that provides improved design, facilitating easier assembly as well as better integration into devices to be protected.

As used herein the term "thyristor device" may include a single thyristor, a silicon controlled rectifier (SCR) or a TRIAC device. As is known, a thyristor device is related to a silicon controlled rectifier, where an SCR is composed of a layered structure having an arrangement of N-type semiconductor regions or layers as well as P-type semiconductor layers or regions, in a four layer sequence of P-N-P-N, for example. In a thyristor, a gate is connected to an inner layer of the four-layer device. A TRIAC may be considered a type of thyristor where current conduction may take place in both directions, as opposed to a single thyristor that conducts current in just one direction.

The present embodiments address the deficiencies in thyristor performance by coupling a special device, termed herein a negative temperature coefficient (NTC) device to a thyristor device. As detailed herein the NTC device may be placed thermally close to the thyristor, meaning in good thermal contact with the body that include the thyristor, such as a silicon die. Additionally, the NTC device may be electrically connected to terminals of the thyristor so as to reduce the changes in trigger current of the thyristor as a function of temperature.

According to various embodiments of the present disclosure an NTC device may be an NTC thermistor where electrical resistance (also referred to herein merely as "resistance") decreases substantially as a function of increasing temperature. In various embodiments the NTC device is a component made of semi-conductive ceramic material. The NTC device may be shaped as a disc, a plate, a cylinder, an elongated body, or other suitable shape. A suitable composition for an NTC device according to embodiments of the disclosure may be based upon a non-conductive metal oxide such as ZnO (zinc oxide), TiO2 (titanium oxide) or BaTiO3 (barium titanate) or a more complex mixture of metal oxides. To the base composition, a dopant oxide such as MnO2 (manganese oxide) or Fe2O3 (ferrous oxide) may be added in a molar fraction that is effective to generate a room temperature resistance between 100 Ohm to 100kOhm, with B parameter (Beta parameter) value between 2000K to 6000K over 25° C. to 85° C., or over 25° C. to 50° C. When doped at a suitable level of dopant oxide, such an oxide material may become electrically conductive (or more properly, semiconductive) with a resistance that exhibits a negative temperature coefficient.

In various embodiments, a commercially available NTC thermistor may be used to couple to a thyristor device, where the NTC thermistor composition, characteristics and size, may be chosen to suit a given thyristor device and application. By arranging a thyristor device assembly to include an NTC thermistor that is electrically coupled to two different device terminals of the thyristor and is in good thermal contact with the thyristor die, the NTC thermistor will change the resistance of gate-cathode (or MT1) path and provides proper current division both at room temperature and at high temperature. As detailed in the embodiments to follow, an NTC device may be placed directly onto a thyristor die inside a thyristor package, or placing the NTC device onto leads of a lead frame, or onto a heat sink tab of the thyristor package, or by placing the NTC thermistor onto a connecting pad for a cathode or MT1 on a circuit board.

More generally, various embodiments may provide a protection device that includes a thyristor device and an NTC device. The thyristor device may include a first device terminal, a second device terminal, and a gate terminal. In embodiments where the thyristor device is an SCR, the first device terminal may be a cathode terminal and second device terminal an anode terminal. In embodiments where the thyristor device is a TRIAC, the first device terminal may be a first main terminal (MT1) and second device terminal a second main terminal (MT2) as known in the art. As such, the NTC device is electrically coupled to the gate terminal of the thyristor device on a first end, and electrically coupled to the first device terminal of the thyristor device on a second end, wherein the NTC device is also thermally coupled to the thyristor device.

Figure 1:
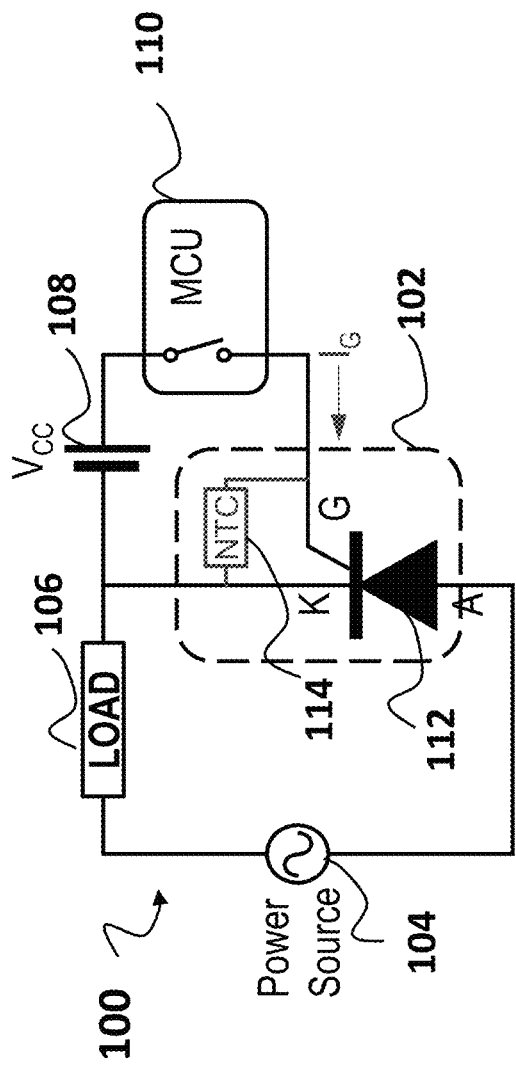
FIG. 1 presents a circuit representation of a switch arrangement according to embodiments of the disclosure.

Turning now to FIG. 1 there is shown a circuit representation of a switch arrangement 100 according to embodiments of the disclosure. A power source 104 is coupled to a thyristor device assembly 102, arranged in accordance with embodiments of the disclosure. In this example, the thyristor device assembly 102 includes an SCR 112 and an NTC device 114. A first terminal of the NTC device 114 is electrically coupled to the cathode (K) of the SCR 112, while a second terminal of the NTC device 114 is coupled to the gate G of the SCR 112. A load 106 is also provided in electrical series between the power source 104 and cathode of the SCR 112. A controller 110 is reversibly electrically coupled on one side to the gate G of the SCR 112, and electrically coupled to the cathode on another side through the voltage VCC 108. The controller 110 may supply a gate current IG to trigger the SCR 112, as shown.

Figure 5A:
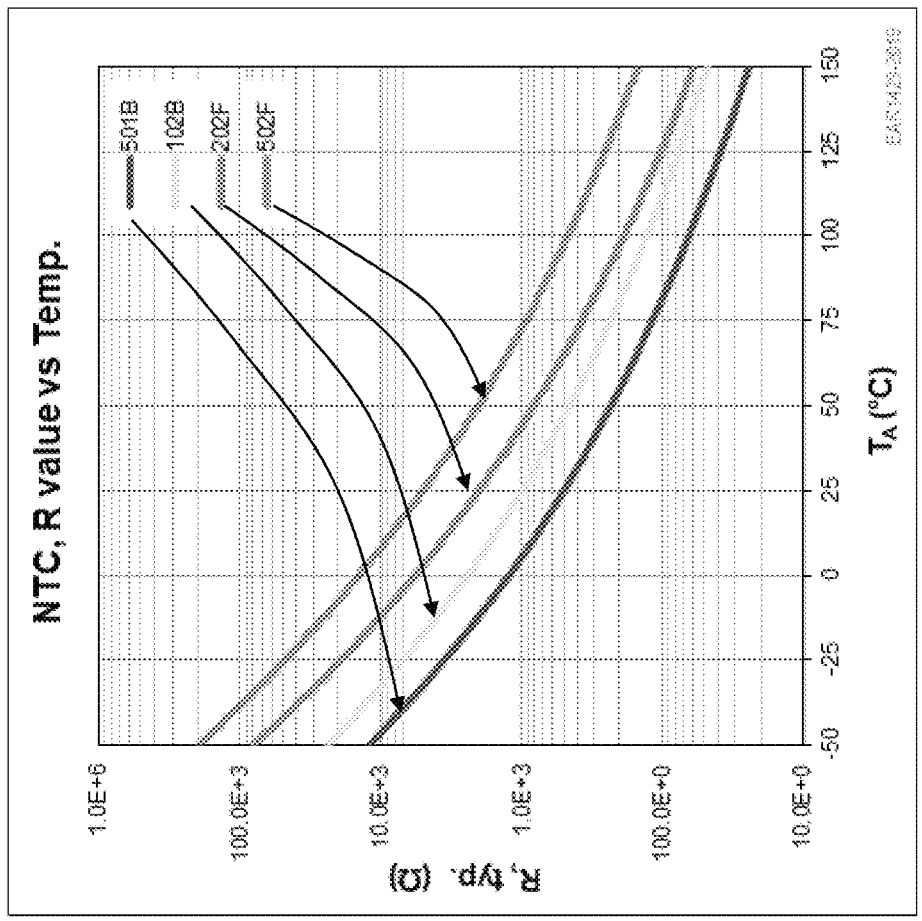
FIG. 5A presents exemplary resistance vs temperature curves for example NTC thermistors that are suitable for use in thyristor device assemblies according to embodiments of the disclosure.
Figure 5B:
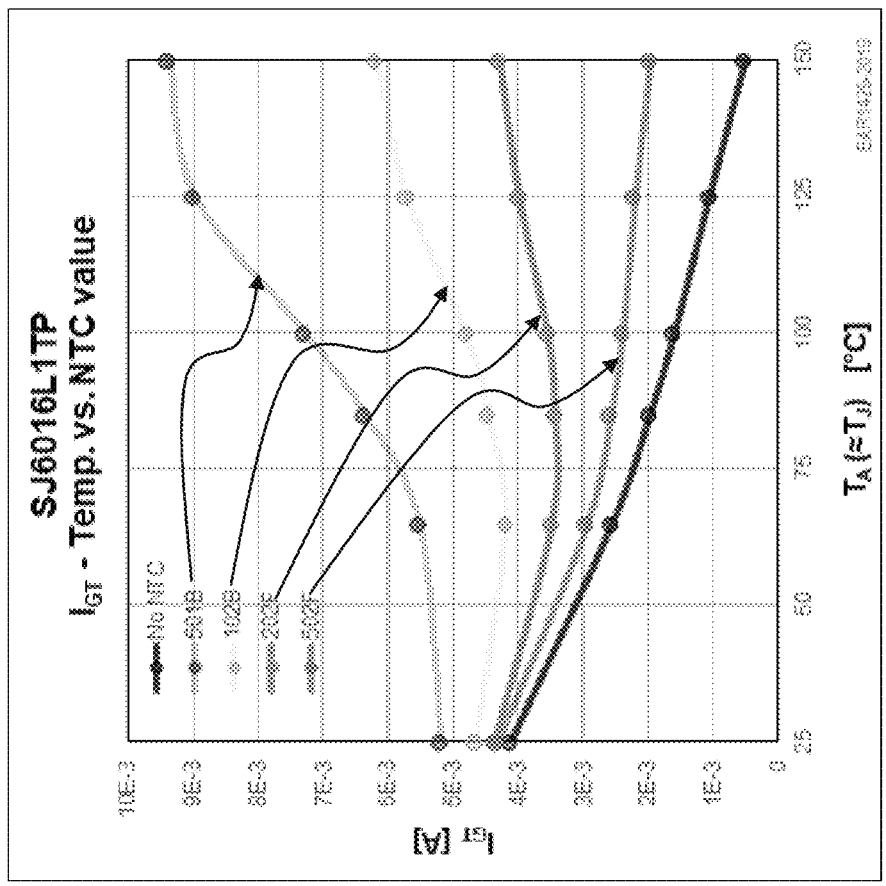
FIG. 5B presents gate trigger current behavior as a function of temperature for several thyristor device assemblies, arranged according to embodiments of the disclosure using the NTC thermistors of FIG. 5A.

When operating as a stand-alone device without the addition of the NTC device 114, if the temperature of the SCR 112 increases, the gate trigger current IGT, may decrease substantially, as shown in the lower curve of FIG. 5B. Turning briefly to FIG. 5B, there is shown a graph depicting gate trigger current as a function of temperature for an exemplary SCR without an NTC device. The value of trigger current decreases from a value of 4 mA at room temperature to 0.5 mA at 150 C, a value that may expose the SCR to instability and random triggering from noise, for example. To address this issue, the protection arrangement 100 places the NTC device 114, electrically coupled to the gate and cathode, providing an additional current path, as shown.

In the protection arrangement 100, and as discussed with respect to the embodiments to follow, the NTC device 114 may be placed in good thermal contact with the SCR 112. As such, when the SCR 112 heats up, heat from the SCR 112 and adjacent structures may heat the NTC device 114, causing electrical resistance of the NTC device to decrease. Turning briefly to FIG. 5A, there are shown exemplary resistance vs temperature curves for example NTC materials that are suitable for use in thyristor device assemblies according to embodiments of the disclosure. As shown, the resistance decreases in the range of three orders of magnitude over the temperature range—50 C to –150 C for several different NTC devices. The effect of this resistance decrease is to provide an increasing current path with increasing temperature. In the protection arrangement 100, the increased current through NTC device 114 may have the effect of decreased gate trigger current through SCR 112, as discussed in more detail below. As a result, the thyristor device assembly 102 may provide better electrical behavior for the SCR up to high temperatures, where gate trigger current may be maintained at suitable levels for stable operation.

FIG. 2 presents a circuit representation of another switch arrangement according to other embodiments of the disclosure. The switch arrangement 120 may have similar components as protection arrangement 100, arranged in a similar circuit configuration as FIG. 1, with a difference that the thyristor device assembly 122 includes a TRIAC 124, instead of the SCR 112. As such, the gate of TRIAC 124 is coupled to a first terminal of NTC device 114, as shown, while an MT1 terminal of the TRIAC 124 is coupled to the second terminal of NTC device 114.

FIG. 3 presents a top perspective view of a thyristor device assembly 102A according to some embodiments of the disclosure. In the thyristor device assembly 102A, a thyristor die 152 is provided, meaning a semiconductor die that contains or forms a thyristor device. In different non-limiting embodiments, the thyristor die 152 may be an SCR die or a TRIAC die. The thyristor device assembly 102A further includes an NTC thermistor die 154, disposed on a surface of the thyristor die 152. The NTC thermistor die 154 may be bonded to the thyristor die 152, and electrically coupled to the thyristor die 152 via solder or other medium. In this example, a lower surface of the NTC die 154 is electrically connected to a terminal of the thyristor die 152, such as the cathode of an SCR die, or the MT1 terminal of a TRIAC die. In addition, an upper surface (the visible surface in FIG. 3) of the NTC thermistor die 154 is electrically connected to the gate 156 of the thyristor die 152, meaning a gate of a SCR device or TRIAC device that is formed in the thyristor die 152. In the example of FIG. 3, the NTC thermistor die 154 may be a small piece of NTC ceramic, such as a plate or a chip, generally smaller than the thyristor die 152.

The upper surface of the NTC thermistor die 154 may be electrically connected to the gate 156 of the thyristor die 152, indirectly, as shown in FIG. 3. In FIG. 3, the thyristor device assembly 102A is connected to a lead frame 160, such as a known lead frame structure. The lead frame 160 includes three leads, lead 166, which may be a cathode (MT1) lead for connecting to a terminal formed on the top surface of the thyristor die 152, such as via a bonding wire, or other suitable means. The lead frame 160 also includes a lead 164, which may be an anode (MT2) lead, for electrically connecting to a terminal formed on the bottom surface of the thyristor die 152, and a lead 166, which may be a gate lead. In the example of FIG. 3, one bonding wire, bonding wire 158A, connects the upper surface of the NTC thermistor die 154 to the lead 166, while a second bonding wire, bonding wire 158B, connects the lead 166 to the gate 156, thus providing an electrical connection between the upper surface of the NTC thermistor die 154 and the gate 156. However, other means of electrically connecting the NTC thermistor die 154 to gate 156 are possible, as will be apparent to those of ordinary skill in the art. For example, the connection does not need to be wire-bonding, but can be other methods such as a clip attach.

The arrangement of FIG. 3 thus places the NTC thermistor die 154 in an electrical path in series between the cathode (MT1) terminal, which is connected to the lower surface of the NTC thermistor die 154, and gate 156 of the thyristor die 152, as represented in FIG. 1 for an SCR embodiment, or alternatively in FIG. 2 for a TRIAC embodiment. In addition, by being bonded directly on the thyristor die 152, the NTC thermistor die 154 is in good thermal contact with the thyristor die 152, so that the temperature of the NTC thermistor die 154 may closely track the temperature of the thyristor die 152. Thus, when the thyristor die 152 heats up, tending to reduce gate trigger current, the NTC thermistor die 154 will also heat up, causing a reduced electrical resistance path for a current source, and tending to increase gate trigger current to counteract the characteristics of the thyristor die 152 alone.

FIG. 4 presents a top perspective view of a thyristor device assembly 102B according to other embodiments of the disclosure. In the thyristor device assembly 102B, a thyristor die 152 may be provided, meaning a semiconductor die that contains or forms a thyristor device. In different non-limiting embodiments, the thyristor die 152 may be an SCR die or a TRIAC die. In the view of FIG. 4, the thyristor die 152 is not visible, and is contained within housing 170. The three different terminals of the thyristor die may be electrically connected to the lead frame 160, generally as described above with respect to FIG. 3.

The thyristor device assembly 102B may also include a discrete NTC thermistor 172, such as a thermistor formed in a glass package, as known in the art. The discrete NTC thermistor 172 may include a first thermistor lead 172A, electrically coupled via lead 162 to a first terminal of the thyristor die 152, such as a the cathode of the SCR die, or an MT1 terminal of a TRIAC die. The discrete NTC thermistor 172 further includes a second thermistor lead 172B, electrically coupled to a gate lead of the thyristor die via lead 166. For example, the first thermistor lead 172A and second thermistor lead 172B may be electrically connected to the lead 162 and lead 166, respectively, using a solder 174, or other suitable conductive medium. As further shown in FIG. 4, the discrete NTC thermistor 172 is disposed in thermal contact with the lead 164, such as and anode lead in the case of an SCR die, or an MT2 lead in the case of a TRIAC die. Thermal contact may be facilitated by use of thermal grease 176, disposed between the body of the discrete NTC thermistor 172 and the lead 164. The lead 164 may be formed of copper plate (see also FIG. 3), bonded to the lower surface of the thyristor die 152, forming a good thermal path between the body of the discrete NTC thermistor 172 and the thyristor die 152. However, in this configuration, NTC thermistor resistance value calculation may need to be modified as the temperature of the anode lead may be different from the temperature of the thyristor die 152, inside the housing 170.

EXAMPLES

To highlight advantages of the present embodiments, several examples including empirical data are provided as detailed with respect to the tables and FIGS. 5A-7 to follow. According to various embodiments of the disclosure, an NTC thermistor may be provided in good thermal contact with a thyristor device and in a circuit arrangement as shown with respect to FIGS. 1-2.

A selection of suitable NTC thermistor may depend upon several considerations including targeted resistance values to be achieved by a thyristor device. In one example, an NTC thermistor value selection may be performed in the following manner: a) Calculate a target or required resistance value at a selected elevated temperature by selecting a target IG (gate current) and by taking into account a thyristor's actual IGT (gate trigger current) and gate trigger voltage (VGT). For example, the IG may be targeted to be the same as an actual IGT value at 25° C.

Using a commercial SCR device, SJ6016L1TP, manufactured by Littelfuse, VGT and IGT values at 150° C. are 0.26V and 0.51 mA, respectively. A target IG may be set at 4.12 mA, which value represents the 25° C. value. With this target for gate current, the required resistance value at 150° C., R150° C., of an NTC Thermistor is given by:

$$R150° C.=VGT/(IG-IGT)=0.26V/(4.12\ mA-0.51\ mA)=72.0\ \Omega \quad (Eq.\ 1)$$

Given the required or target resistance value at high temperature (in this case 150° C.), a suitable NTC thermistor may be chosen to yield a resistance value close to the value from Eq (1). Table I. provides example resistances corresponding to four different commercial thermistors, where the corresponding resistance vs temperature curves are shown in FIG. 5A. As shown in table I. within the range of samples provided, 202FG1K has the closest R value at 150° C. for SCR SJ6016L1TP, 60Ω, against a target of 72.0Ω. Of course, the table I. is provided for purposes of illustration, and any suitable NTC thermistor yielding an appropriate value of high temperature resistance may be chosen in accordance with embodiments of the present disclosure.

TABLE 1

| Part Number | Resistance at 25° C. (Ω) | Resistance at 125° C. (Ω) | Resistance at 150° C. (Ω) | B constant (0-50° C.) |
|---|---|---|---|---|
| 501BG1K | 500 | 39 | 24 | 2,941 |
| 102BG1J | 1,000 | 77 | 48 | 2,941 |
| 202FG1K | 2,000 | 102 | 60 | 3,419 |
| 502FG1K | 5,000 | 255 | 149 | 3,419 |

Another consideration for selecting an appropriate NTC thermistor is to provide a high B constant where a higher B constant means a larger resistance change with temperature. Commercially available NTC thermistors may exhibit a B constant of 3,000 to 5,000, for example. As shown in table I. the commercial examples all have values in the range of 3,000 to approximately 3,500.

FIG. 5B presents gate trigger current behavior as a function of temperature for different thyristor device assemblies, arranged according to embodiments of the disclosure. In these examples, a commercial SCR SJ6016L1TP is coupled with various NTC thermistors attached between gate and cathode of SJ6016L1TP, as generally represented by the thyristor device assembly 102. The various curves, represent the behavior of thyristor device assemblies arranged with the commercial NTC thermistors listed in table I, with the last three digits not shown. Notably, in comparison with the lower curve, representing gate trigger current behavior of the SJ6016L1TP SCR by itself, the gate trigger current remains much higher in all thyristor device assemblies using the thermally coupled NTC thermistors. In some examples, the value of gate trigger current at 150 C is higher than at room temperature, while in other examples, the value is lower. Based upon the above considerations a selected NTC thermistor, 202FG1K (shown as 202F) keeps IGT almost flat over the exemplary temperature range, between 3 and 5 mA. This behavior represents a great improvement in high temperature IGT from the value of 0.5 mA at 150° C. without a NTC thermistor to a value of 4.2 mA with the addition of the 202FG1K NTC thermistor. Notably, examples where gate trigger current substantially increases at 150 C are also unacceptable as the values may exceed current values that can be handled by a given controller.

Figure 5D:
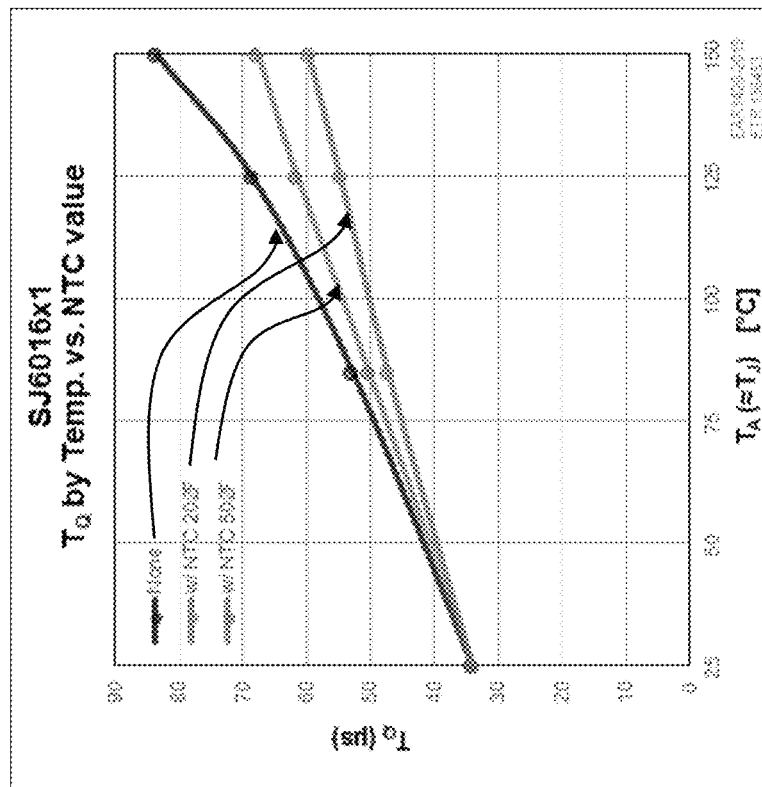
FIG. 5D presents Tq behavior as a function of temperature for select thyristor device assemblies corresponding to the data of FIG. 5B.
Figure 5C:
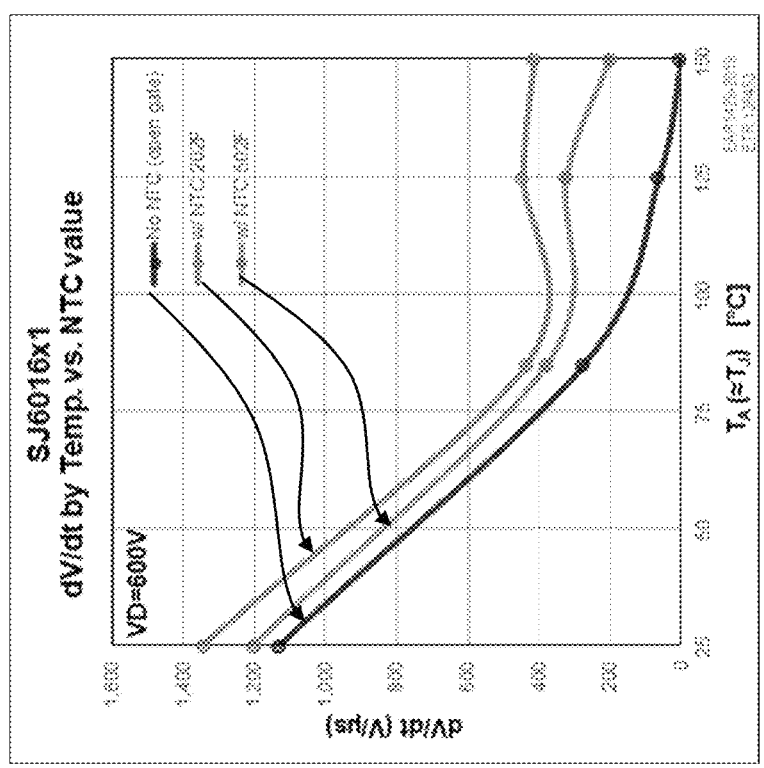
FIG. 5C presents dV/dt behavior as a function of temperature for select thyristor device assemblies corresponding to the data of FIG. 5B.

FIG. 5C presents dV/dt behavior as a function of temperature for select thyristor device assemblies corresponding to the data of FIG. 5B. The dV/dt is a dynamic characteristic value which value indicates an SCR's off-state noise immunity. In particular the data reflects the following experiments where a commercial SCR SJ6016L1TP was tested without the addition of an NTC thermistor (lower curve), and with the addition of NTC thermistor 202FG1K or NTC thermistor 502FG1K, as shown. In the testing a value of VD of 600V is used, which value represents a worst test condition for dV/dt.

Without the addition of an NTC thermistor, the SJ6016L1TP SCR alone cannot hold a VD if 600 V at 150° C., shown as 0V/μs in the graph of FIG. 5C. Even at 125° C., the dV/dt value is very low, just 63V μs, indicating a limited ability to perform reliably above temperatures of 100° C. or so.

With the addition of the commercial NTC thermistor 502FG1K, in accordance with embodiments of the disclosure, the value of dV/dt was improved to 200V/μs at 150° C., which is high enough for practical applications, while the addition of the commercial NTC thermistor 202FG1K, increases dV/dt to 400V/μs at 150° C., close to the 75° C. value of the SCR device without addition of a NTC thermistor.

FIG. 5D presents Tq behavior as a function of temperature for the thyristor device assemblies corresponding to the data of FIG. 5C. Tq, or turn-off time, is a dynamic characteristic value which value indicates an SCR's capability of turning-off under high frequency incoming AC. As with the data of FIG. 5C, a commercial SCR, SJ6016L1TP, was tested without the addition of an NTC thermistor, with the addition of NTC thermistor 202FG1K, and with the addition of NTC thermistor 502FG1K, all under the same standard test conditions. Without the addition of an NTC thermistor, the SCR SJ6016L1TP device by itself yields a Tq of approx. 85 μsec at 150° C. With the addition of NTC thermistor 502FG1K, Tq improves to 68 μsec at 150° C., while with the addition of NTC thermistor 202FG1K, Tq further improves to 60 μsec at 150° C., close to the 100° C. value yielded by an SCR SJ6016L1TP device without addition of an NTC thermistor.

Figure 6A:
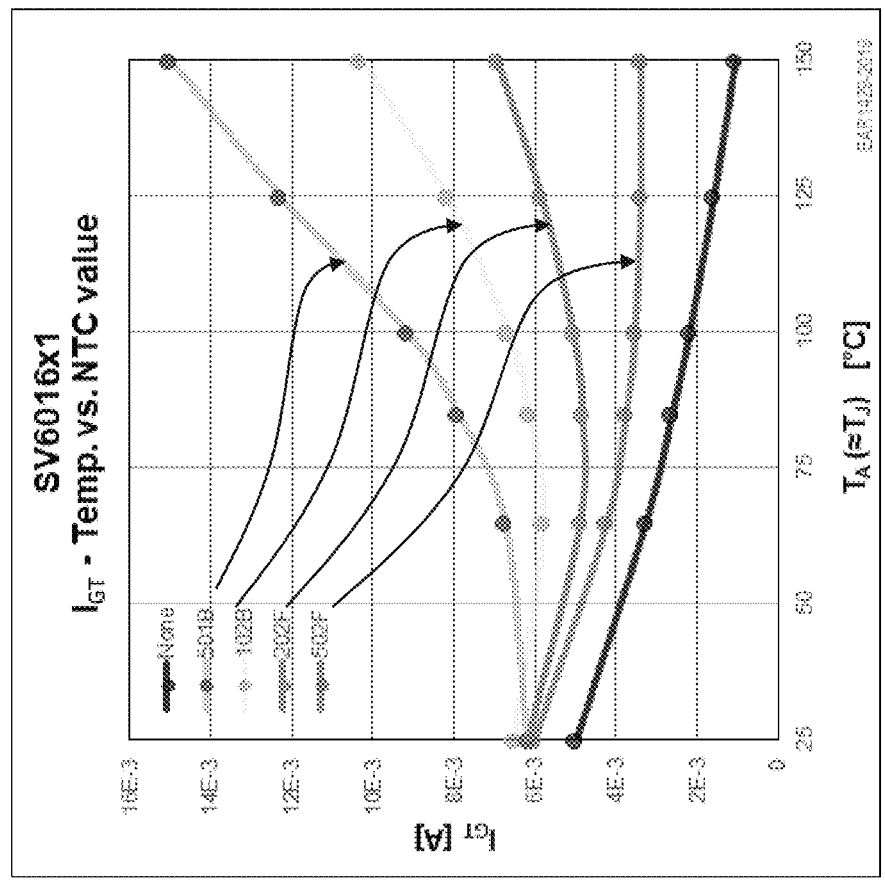
FIG. 6A presents gate trigger current behavior as a function of temperature for another set of thyristor device assemblies, arranged according to embodiments of the disclosure.

FIG. 6A presents gate trigger current behavior as a function of temperature for another set of thyristor device assemblies, arranged according to embodiments of the disclosure. In a further set of experiments, the electrical behavior of thyristor (in this case SCR) device assemblies was tested using a different commercial SCR, SV6016L1TP. SV6016L1TP has a different die design for better high temperature dV/dt than the SJ6016 SCR die design. However, with the addition of a NTC thermistor, as shown in the following figures, the overall high temperature performance is substantially improved.

An SCR SV6016L1TP, standing alone, yields a VGT at IGT at 150° C. is 0.38V and 1.06 mA, respectively. Using a target IG of 4.99 mA, a targeted R150° C. of NTC Thermistor is given by R150° C.=VGT/(IG−IGT)=0.38V/(4.99 mA−1.06 mA)=96.7Ω. Based upon this criterion, a NTC thermistor 202FG1K (60 Ω at 150° C.) may be selected as closest matching the targeted resistance of 96.7Ω (see also FIG. 5A for resistance values as a function of temperature for various NTC thermistors).

Turning again to FIG. 6A, the graph shows IGT—temperature curves generated by the SCR SV6016L1TP, with various NTC thermistors attached between gate and cathode of SV6016L1TP, with good thermal contact between SCR and NTC thermistor. Notably, in comparison with the lower curve, representing gate trigger current behavior of the SV6016L1TP SCR by itself, the gate trigger current remains much higher in all thyristor device assemblies using the thermally coupled NTC thermistors. In some examples, the value of gate trigger current at 150° C. is higher than at room temperature, while in other examples, the value is lower. The NTC thermistor 202FG1K works particularly well, maintaining IGT between 5 mA and 7 mA between 25° C. and 150° C.

Figure 6C:
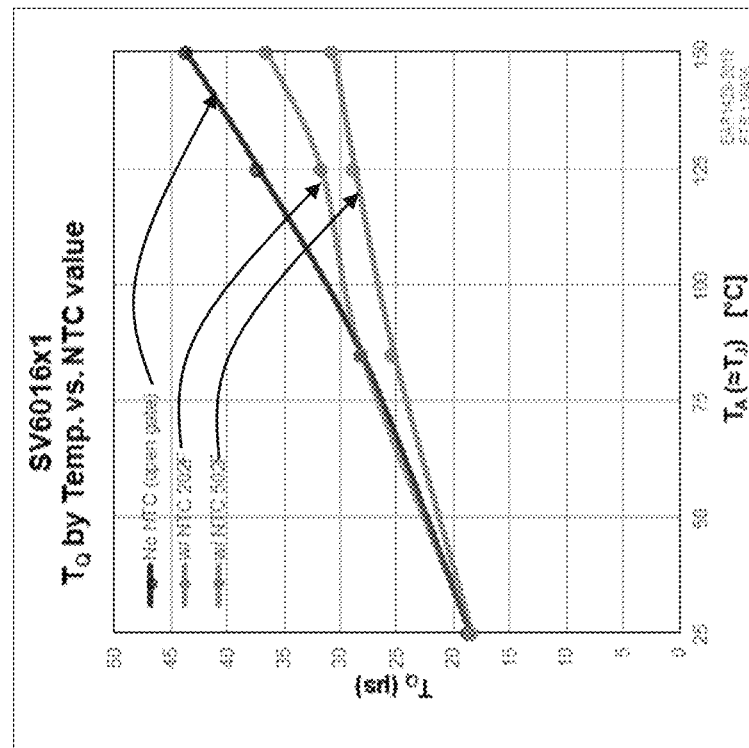
FIG. 6C presents Tq behavior as a function of temperature for select thyristor device assemblies corresponding to the data FIG. 6A.
Figure 6B:
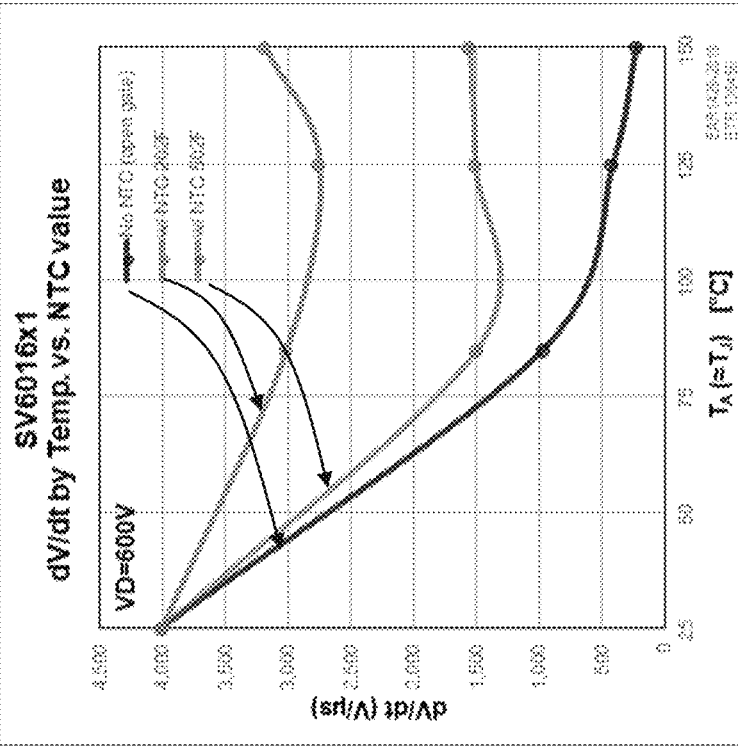
FIG. 6B presents dV/dt behavior as a function of temperature corresponding to select thyristor device assemblies corresponding to the data FIG. 6A.

FIG. 6B presents dV/dt behavior as a function of temperature corresponding to select thyristor device assemblies corresponding to the data FIG. 6A. As shown in the graph, compared to the SCR SJ6016L1TP, the use of SCR SV6016L1TP by itself yields a better value of dV/dt at high temperature, approximately 200V/μs at 150° C. By adding an NTC thermistor 202FG1K, dV/dt is greatly improved to 3,100 V/μs level. This value is high enough to handle any noise practically possible in an incoming AC line.

FIG. 6C presents Tq behavior as a function of temperature for the thyristor device assemblies corresponding to the data FIG. 6B. As shown in the graph, compared to the SCR SJ6016L1TP, the use of SCR SV6016L1TP by itself yields a better value of Tq, approximately reducing the time by half. By adding an NTC thermistor 202FG1K, Tq was further improved, with a value at 150° C. similar to the value of SCR SV6016L1TP by itself without NTC at 90° C.

In further experiments, the addition of NTC thermistors to TRIACs was tested using the same approach as described above with respect to FIGS. 5A-6C. In these experiments, a commercial TRIAC Q6016LH1LEDTP was tested, having the properties of VGT and IGT at 125° C. of 0.29V and 0.79 mA, respectively. In this example, a target gate current IG of 3.0 mA may be used, wherein the target value for R125° C. of an NTC thermistor is given by: R125° C.=VGT/(IG−IGT)=0.29V/(3.00 mA−0.79 mA)=131.2Ω. Accordingly, based upon FIG. 5A, the NTC thermistor 202FG1K (102Ω at 125° C.) may be selected to add to the TRIAC Q6016LH1LEDTP.

Figure 7:
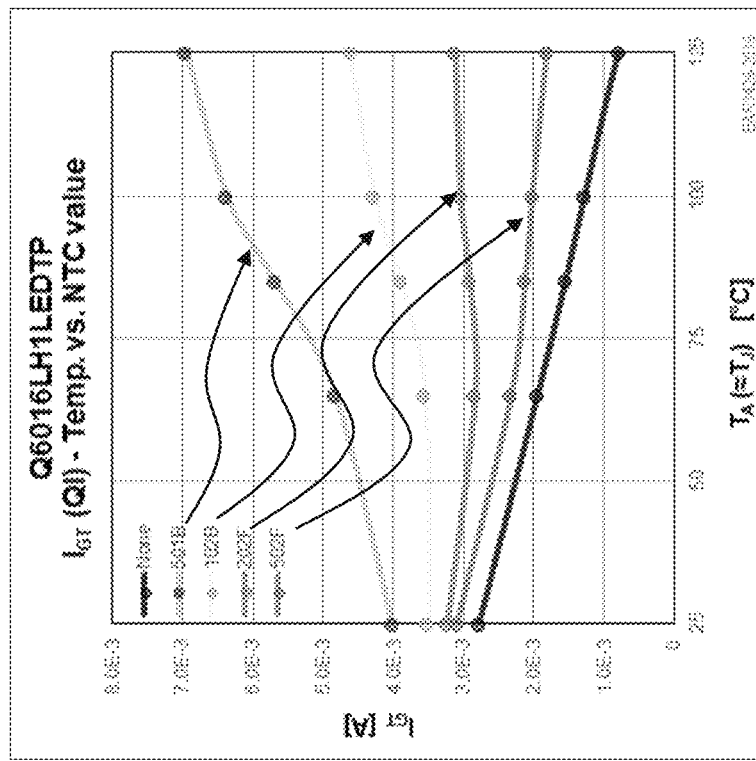
FIG. 7 presents gate trigger current behavior as a function of temperature for a further set of thyristor device assemblies, arranged according to an embodiment of the disclosure.

FIG. 7 presents gate trigger current behavior as a function of temperature for a further set of thyristor device assemblies, arranged according to an embodiment of the disclosure. In this case, the graph depicts IGT—temperature curves of TRIAC Q6016LH1LEDTP, with the addition of various NTC thermistor, arranged in good thermal contact and attached between gate and MT1 of the TRIAC Q6016LH1LEDTP.

Notably, in comparison with the lower curve, representing gate trigger current behavior of the SV6016L1TP SCR by itself, the gate trigger current remains much higher in all thyristor device assemblies using the thermally coupled NTC thermistors. In some examples, the value of gate trigger current at 150° C. is higher than at room temperature, while in other examples, the value is lower. The NTC thermistor, 202FG1K (pink line), maintains IGT almost flat over the entire range of temperature, varying just between 2.8 mA and 3.2 mA. This result represents a large improvement in high temperature IGT for the TRIAC without added NTC thermistor, from 0.8m A at 125° C. to over 3 mA.

In experiments to measure dV/dT performance, the addition of an NTC thermistor did not appreciably change the dV/dt behavior with respect to using a SV6016L1TP TRIAC alone, while the advantage of high temperature IGT improvement generated by adding an NTC thermistor is evident as noted.

Figure 8:
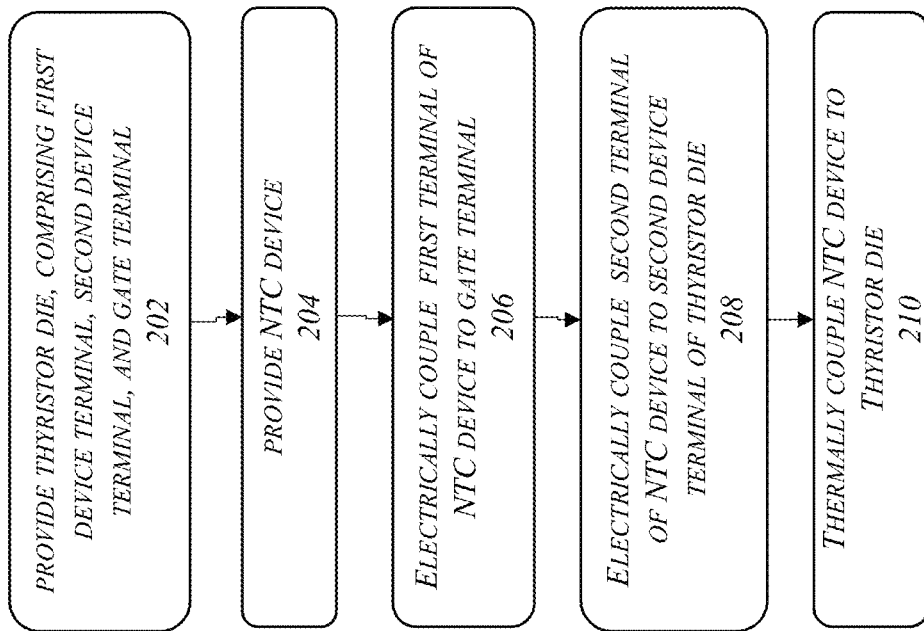
FIG. 8 presents an exemplary process flow according to embodiments of the disclosure.

FIG. 8 presents an exemplary process flow 200, according to embodiments of the disclosure. At block 202 a thyristor die is provided. The thyristor die may include a first device terminal, a second device terminal, and a gate terminal. In the case of an SCR die, the first device terminal may be a cathode terminal, while the second device terminal is an anode terminal. In the case of a TRIAC die, the first device terminal may be an MT1 terminal, while the second device terminal is an MT2 terminal.

At block 204, an NTC device is provided, such as an NTC thermistor. The NTC device may be formed of a semiconductive ceramic material as known in the art. The NTC device may be arranged as a disc, or die, or may be a discrete NTC thermistor, in accordance with different non-limiting embodiments.

At block 206, the first terminal of the NTC device may be coupled electrically to the gate terminal of the thyristor die. In one example, the top surface of an NTC die may form a first terminal, where the first terminal is connected by wire bond, clip or other structure to a gate lead. The gate lead may in turn be connected to the gate terminal of the thyristor die, such as through a wire bond or other structure. In another example, a discrete NTC thermistor may have a first terminal that is soldered to a gate lead of a lead frame, where the gate lead is electrically coupled to the gate terminal of the thyristor die.

At block 208, the second terminal of the NTC device may be coupled electrically to the first device terminal of the thyristor die. In one example, the bottom surface of an NTC die may form a second terminal, where the second terminal is connected by solder or other medium to the top surface of the thyristor die.

At block 210, the NTC device is thermally coupled to the thyristor die. The thermal coupling may take place by using solder or other conductive medium to bond a NTC thermistor die to a thyristor die. In other embodiments, the thermal coupling may take place by placing the body of a discrete NTC thermistor over an anode lead of a lead frame that is connected to the thyristor die. The body of the discrete NTC thermistor may be coupled to the anode lead by the use of thermal grease, for example. As such, heat transfer between the thyristor die and the NTC thermistor device will be more effective.

While the present embodiments have been disclosed with reference to certain embodiments, numerous modifications, alterations and changes to the described embodiments are possible while not departing from the sphere and scope of the present disclosure, as defined in the appended claims. Accordingly, the present embodiments are not to be limited to the described embodiments, and may have the full scope defined by the language of the following claims, and equivalents thereof.

What is claimed is:

1. A thyristor device assembly, comprising:
a thyristor device comprising a first device terminal, a second device terminal, and a gate terminal;
a housing, disposed around the thyristor device;
a lead frame, disposed in electrical contact with the thyristor device and extending outside of the housing, the lead frame comprising a gate lead and a first terminal lead, electrically coupled to the gate terminal and the first device terminal of the thyristor device, respectively; and
a negative temperature coefficient (NTC) device disposed outside the housing, the NTC device being electrically coupled to the gate terminal of the thyristor device on a first end, and being electrically coupled to the first terminal of the thyristor device on a second end;
wherein the NTC device is disposed in thermal contact with a second terminal lead of the lead frame, the second terminal lead connected to the second device terminal.

2. The thyristor device assembly of claim 1, wherein the NTC device comprises a discrete NTC thermistor having a first thermistor lead electrically connected to the first terminal lead, and a second thermistor lead electrically connected to the gate lead.

3. The thyristor device assembly of claim 1, wherein the NTC device comprises a zinc oxide, titanium oxide, barium titanate, or an oxide doped with a dopant oxide.

* * * * *